(12) United States Patent
Parvarandeh et al.

(10) Patent No.: US 12,176,023 B2
(45) Date of Patent: Dec. 24, 2024

(54) NON-VOLATILE STATIC RANDOM ACCESS MEMORY BIT CELLS WITH FERROELECTRIC FIELD-EFFECT TRANSISTORS

(71) Applicant: GlobalFoundries U.S. Inc., Malta, NY (US)

(72) Inventors: Pirooz Parvarandeh, Los Altos Hills, CA (US); Venkatesh P. Gopinath, Fremont, CA (US); Navneet Jain, Milpitas, CA (US); Bipul C. Paul, Mechanicville, NY (US); Halid Mulaosmanovic, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 101 days.

(21) Appl. No.: 18/080,456

(22) Filed: Dec. 13, 2022

(65) Prior Publication Data
US 2024/0194253 A1 Jun. 13, 2024

(51) Int. Cl.
*G11C 11/00* (2006.01)
*G11C 11/412* (2006.01)
*G11C 11/419* (2006.01)
*H01L 21/28* (2006.01)
*H10B 10/00* (2023.01)

(52) U.S. Cl.
CPC .......... *G11C 11/412* (2013.01); *G11C 11/419* (2013.01); *H01L 29/40111* (2019.08); *H10B 10/12* (2023.02)

(58) Field of Classification Search
CPC .................. G11C 11/412; G11C 11/419; H01L 29/40111; H10B 10/12

USPC .......................................................... 365/154
See application file for complete search history.

(56) References Cited

U.S. PATENT DOCUMENTS

| | | | |
|---|---|---|---|
| 6,944,042 B2 * | 9/2005 | Komatsuzaki | G11C 11/5657 365/205 |
| 6,996,000 B2 | 2/2006 | Chen et al. | |
| 7,894,234 B2 * | 2/2011 | Rodriguez | G11C 8/10 365/145 |
| 8,472,236 B2 * | 6/2013 | Summerfelt | G11C 11/22 365/148 |
| 9,368,208 B1 * | 6/2016 | Marshall | G11C 14/0081 |
| 9,514,816 B1 * | 12/2016 | Ashokkumar | G11C 14/0072 |
| 9,830,990 B2 * | 11/2017 | Izumi | G11C 14/0072 |
| 10,818,355 B2 * | 10/2020 | Fuchikami | G11C 11/4125 |
| 11,024,346 B2 * | 6/2021 | Kanda | H03K 3/356 |

(Continued)

OTHER PUBLICATIONS

Wei-Xiang You et al, "A New Hybrid nonvolatile SRAM with Ferroelectric FET", Feb. 2020, Journal of Electronic Devices Society, vol. 8 , pp. 171-175. (Year: 2020).*

(Continued)

*Primary Examiner* — Viet Q Nguyen
(74) *Attorney, Agent, or Firm* — Thompson Hine LLP; David Cain

(57) ABSTRACT

Structures for a static random access memory bit cell and methods of forming a structure for a static random access memory bit cell. The structure comprises a static random access memory bit cell including a first node and a second node, a first ferroelectric field-effect transistor including a first terminal connected to the first node, and a second ferroelectric field-effect transistor including a second terminal connected to the second node.

20 Claims, 2 Drawing Sheets

(56) References Cited

U.S. PATENT DOCUMENTS

| | | | | |
|---|---|---|---|---|
| 11,929,115 | B2* | 3/2024 | Wang | H10B 53/40 |
| 2003/0162394 | A1* | 8/2003 | Takemura | H10B 10/00 |
| | | | | 438/689 |
| 2004/0141363 | A1 | 7/2004 | Ohtsuka et al. | |
| 2021/0091098 | A1* | 3/2021 | Tsukamoto | G11C 11/221 |
| 2022/0383926 | A1* | 12/2022 | Jung | H03K 3/356008 |
| 2023/0012093 | A1* | 1/2023 | Kakushima | H10B 10/18 |

OTHER PUBLICATIONS

Xueqing Li et al., "Design of nonvolatile SRAM with Ferroelectric FETs for Energy-Efficient Backup and Restore", Jul. 2017, IEEE Transactions on Electronic Devices, vol. 64, No. 7, pp. 3037-3040 (Year: 2017).*

Prakash, R., "Nonvolatile SRAM (nvSRAM) Basics." Cypress Semiconductor Corp., White Paper, 001-89467, pp. 1-9, Aug. 2016.

A. -F. Li, R. -Y. Huang and V.P. -H. Hu, "Variation-Tolerant Recall Operation for Nonvolatile SRAM Integrated with Ferroelectric Capacitor," 2022 6th IEEE Electron Devices Technology & Manufacturing Conference (EDTM), 2022, pp. 213-215, doi: 10.1109/EDTM53872.2022.9798000.

European Patent Office, Extended European Search Report and Opinion issued in European Patent Application No. 23197838.8 on Apr. 24, 2024; 7 pages.

Taiwan Intellectual Property Office. Office Action and Search Report issued in Taiwanese Patent Application No. 112143618 on Jul. 30, 2024; 37 pages.

Korean Intellectual Property Office; Notice of Preliminary Rejection issued in Korean Patent Application No. 10-2023-0158800 on Oct. 7, 2024; 12 pages.

* cited by examiner

NON-VOLATILE STATIC RANDOM ACCESS MEMORY BIT CELLS WITH FERROELECTRIC FIELD-EFFECT TRANSISTORS

BACKGROUND

The present disclosure relates to semiconductor device fabrication and integrated circuits and, more specifically, to structures for a static random access memory bit cell and methods of forming a structure for a static random access memory bit cell.

Static random access memory (SRAM) may be used, for example, to temporarily store data in a computer system. A static random access memory device includes an array of bit cells in which each individual bit cell holds a single bit of data during operation. Each bit cell may include, for example, a six-transistor (6T) design that includes a pair of cross-coupled inverters providing a storage unit and a pair of access transistors connecting the inverters to complementary bit lines. The access transistors are controlled by word lines, which are used to select bit cells for read or write operations. When continuously powered, the memory state of each bit cell persists without the need for data refresh operations. However, the memory state is volatile and is lost when power is removed or lost.

Improved structures for a static random access memory bit cell and methods of forming a structure for a static random access memory bit cell are needed.

SUMMARY

In an embodiment of the invention, a structure comprises a static random access memory bit cell including a first node and a second node, a first ferroelectric field-effect transistor including a first terminal connected to the first node, and a second ferroelectric field-effect transistor including a second terminal connected to the second node.

In an embodiment of the invention, a method comprises forming a first ferroelectric field-effect transistor including a first terminal connected to a first node of a static random access memory bit cell, and forming a second ferroelectric field-effect transistor including a second terminal connected to a second node of the static random access memory bit cell.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
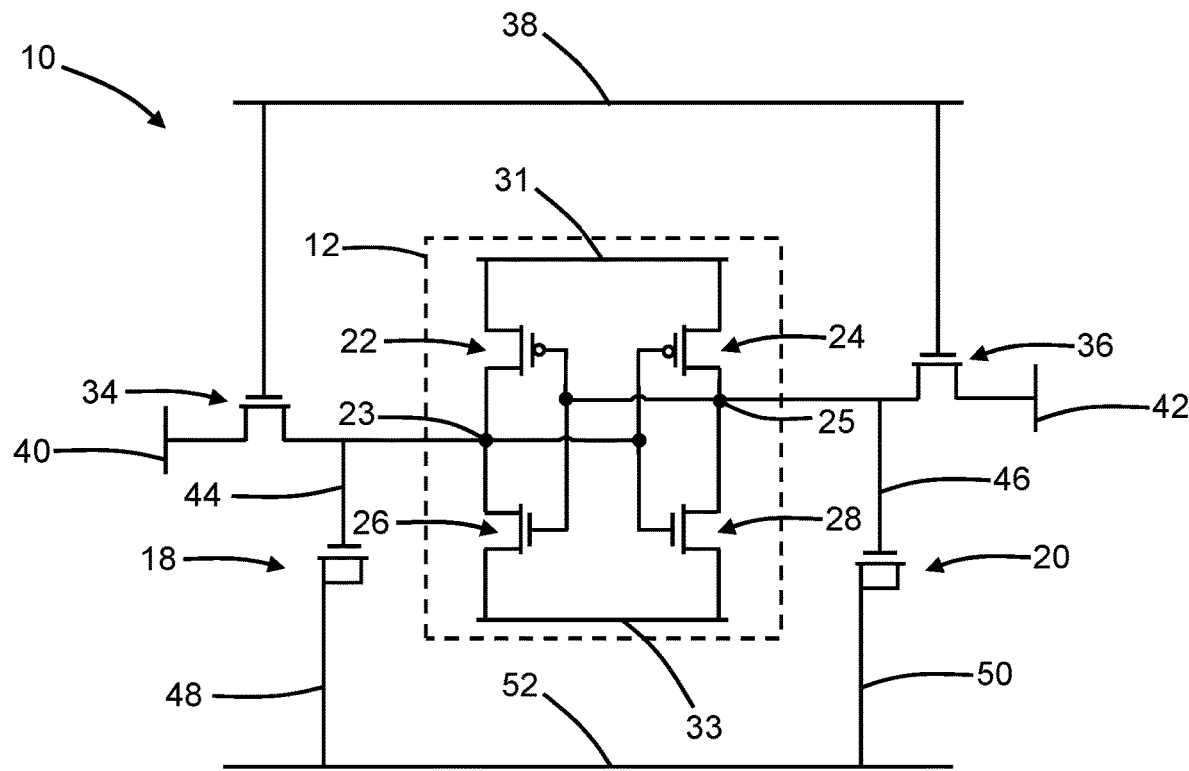
FIG. 1 is a structure including a static random access memory bit cell in accordance with embodiments of the invention.

With reference to FIG. 1 and in accordance with embodiments of the invention, a structure 10 may include a static random access memory (SRAM) bit cell having a storage unit 12, an access transistor 34, and an access transistor 36 that are coupled to define a circuit. In an embodiment, the SRAM bit cell of the structure 10 may include a p-type field-effect transistor 22 and an n-type field-effect transistor 26 connected to define an inverter, and a p-type field-effect transistor 24 and an n-type field-effect transistor 28 connected to define another inverter that is cross-coupled to the inverter including the p-type field-effect transistor 22 and the n-type field-effect transistor 26.

The drain terminals of the p-type field-effect transistor 22 and the n-type field-effect transistor 26 are connected to each other to define a node 23, the gate terminals of the p-type field-effect transistor 22 and the n-type field-effect transistor 26 are connected to each other, the source terminal of the p-type field-effect transistor 22 is connected to a power supply voltage 31, and the source terminal of the n-type field-effect transistor 26 is connected to a ground reference voltage 33. The drain terminals of the p-type field-effect transistor 24 and the n-type field-effect transistor 28 are connected to each other to define a node 25, the gate terminals of the p-type field-effect transistor 24 and the n-type field-effect transistor 28 are connected to each other, the source terminal of the p-type field-effect transistor 24 is connected to the power supply voltage 31, and the source terminal of the n-type field-effect transistor 28 is connected to the ground reference voltage 33. The gate terminals of the p-type field-effect transistor 22 and the n-type field-effect transistor 26 are connected at the node 25 to the drain terminals of the p-type field-effect transistor 24 and the n-type field-effect transistor 28. The gate terminals of the p-type field-effect transistor 24 and the n-type field-effect transistor 28 are connected at the node 23 to the drain terminals of the p-type field-effect transistor 22 and the n-type field-effect transistor 26. In effect, the output of the inverter including the field-effect transistors 22, 26 is connected to the input of the inverter including the field-effect transistors 24, 28 and the node 25, and the output of the inverter including the field-effect transistors 24, 28 is connected to the input of the inverter including the field-effect transistors 22, 26 and the node 23.

The gate terminal of the access transistor 34 and the gate terminal of the access transistor 36 are connected to a word line 38. The access transistor 34 has a source/drain terminal that is connected to a bit line 40, and the access transistor 34 has a source/drain terminal that is connected at the node 23 to the drain terminals of the p-type field-effect transistor 22 and the n-type field-effect transistor 26 and to the gate terminals of the p-type field-effect transistor 24 and the n-type field-effect transistor 28. The access transistor 36 has a source/drain terminal that is connected to a bit line 42 that is complementary to bit line 40, and the access transistor 36 has a source/drain terminal that is connected at the node 25 to the drain terminals of the p-type field-effect transistor 24 and the n-type field-effect transistor 28 and to the gate terminals of the p-type field-effect transistor 22 and the n-type field-effect transistor 26. The bit line 40 supplies a logic level that is complementary to the logic level supplied by the bit line 42.

The access transistors 34, 36 are used to transfer data for both read and write operations. The word line 38 may be used to select the access transistors 34, 36 for writing data to the storage unit 12 or reading data from the storage unit 12. The access transistor 34 may be controlled by a gate voltage applied from the word line 38 to selectively connect the bit line 40 to the node 23. The access transistor 36 may be controlled by a gate voltage applied from the word line 38 to selectively connect the bit line 42 to the node 25. Either a logic-0 or a logic-1 can be written from the bit lines 40, 42 as data to the storage unit 12. The bit line 40 and the bit line 42 may be actively driven high and low by the inverters of the storage unit 12 to read stored data.

In alternative embodiments, the SRAM bit cell of the structure 10 may have a different configuration than a six-transistor static random access memory bit cell. For example, the storage unit 12 may include a pair of field-effect transistors and a pair of resistors that participate in forming a four-transistor (4T) static random access memory bit cell.

The structure 10 may further include a state-storage transistor 18 having a terminal connected to the node 23 of the SRAM bit cell of the structure 10 and a state-storage transistor 20 having a terminal connected to the node 25 of the SRAM bit cell of the structure 10. In an embodiment, a gate terminal of the state-storage transistor 18 may be physically and electrically connected by a line 44 to the node 23 of the SRAM bit cell of the structure 10, and a gate terminal of the state-storage transistor 20 may be physically and electrically connected by a line 46 to the node 25 of the SRAM bit cell of the structure 10. In an embodiment, the lines 44, 46 may lack a switch, such as a transistor, such that the lines 44, 46 coupling the gate terminals of the state-storage transistors 18, 20 to the nodes 23, 25 are unswitched. In an embodiment, the lines 44, 46 may directly connect the gate terminals of the state-storage transistors 18, 20 to the respective nodes 23, 25.

Another terminal of the state-storage transistor 18 may be physically and electrically connected by a line 48 to a signal line 52, and another terminal of the state-storage transistor 20 may be physically and electrically connected by a line 50 to the signal line 52. In an embodiment, a source/drain terminal of the state-storage transistor 18 and a source/drain terminal of the state-storage transistor 20 may be physically and electrically connected to the signal line 52 such that the state-storage transistors 18, 20 have a common source node or a common drain node. In an embodiment, the lines 48, 50 may lack a switch, such as a transistor, such that the lines 48, 50 coupling the source/drain terminals of the state-storage transistors 18, 20 to the signal line 52 are unswitched. In an embodiment, the lines 48, 50 may directly connect the source/drain terminals of the state-storage transistors 18, 20 to the signal line 52. The signal line 52 may be configured to supply programming voltages to the state-storage transistors 18, 20 that are respectively used for store and restore operations.

A write cycle may be performed by applying logic values to the bit lines 40, 42 to write a binary logic state to the storage unit 12 and activating the access transistors 34, 36 to write, for example, a logic-0 to the storage unit 12 as a binary logic state. A logic-1 may be written as a binary logic state to the storage unit 12 by inverting the logic values of the bit lines 40, 42. The state-storage transistors 18, 20 are configured to store the binary logic state (i.e., either logic-0 or logic-1) of the storage unit 12, which effectively makes the SRAM bit cell non-volatile.

In an embodiment, the state-storage transistors 18, 20 may be ferroelectric field-effect transistors that are configured to store the binary logic state of the storage unit 12. The state-storage transistors 18, 20 may have a gate structure with a ferroelectric layer characterized by a polarization state that provides a high-threshold voltage condition and a different polarization state that provides a low-threshold voltage condition. When the SRAM bitcell is powered and active, the ferroelectric layers of both state-storage transistors 18, 20 may have the same polarization state, such as the polarization state that provides the high-threshold voltage condition, and the signal line 52 may be grounded. In the event of removal or interruption of the power to the SRAM bit cell, the polarization state of either the ferroelectric layer of the state-storage transistor 18 or the ferroelectric layer of the state-storage transistors 20 may change such that the state-storage transistors 18, 20 have different threshold voltages. For example, if the storage unit 12 stores a logic-0 and power is removed or interrupted, the state-storage transistor 18 may be switched from the high-threshold voltage condition to a low-threshold condition and the state-storage transistor 20 may maintain the high-threshold voltage condition. Similarly, if the storage unit 12 stores a logic-1 and power is removed or interrupted, the state-storage transistor 20 may be switched from the high-threshold voltage condition to a low-threshold condition and the state-storage transistor 18 may maintain the high-threshold voltage condition. The signal line 52 may be powered with a given voltage value to enable the change in threshold voltage condition.

When power is restored to the SRAM bit cell of the structure 10, the state-storage transistors 18, 20 may function as a dual-capacitance state load on the nodes 23, 25 to tilt a start-up state of the node 23 and the node 25 so as to restore the saved binary logic state of the SRAM bit cell. For a given bias applied to the state-storage transistors 18, 20, the low-threshold voltage state may be characterized by a capacitance, and the high-threshold voltage state may be characterized by a capacitance that differs significantly from the capacitance in the low-threshold voltage state. As a numerical example, the capacitance may be on the order of 0.03 femtofarads in the high-voltage state and on the order of 0.12 femtofarads at 1 volt of bias. The difference in capacitance between the low-threshold voltage state and the high-threshold voltage state selectively pushes the nodes 23, 25 into the stored binary logic state upon power up. The signal line 52 may be powered with a given bias to enable the restoration of the binary logic state. The voltage value on the signal line 52 to restore the binary logic state may differ from the voltage value on the signal line 52 to store the binary logic state. After power is restored, the ferroelectric layers of both state-storage transistors 18, 20 may again be set to the same polarization state, such as the polarization state that provides the high-threshold voltage condition.

Multiple instances of the structure 10 may be deployed in a memory cell array. Each instance of the structure 10 may be used to store a bit of data as either a logic-0 or a logic-1 with the state-storage transistors 18, 20 in each instance contributing non-volatility to the bitcells of the memory cell array The state-storage transistors 18, 20 in the form of the ferroelectric field-effect transistors provide a static random access memory cell that is non-volatile and may result in significant power savings in comparison with the use of resistive random access memory cells and magnetoresistive random access memory cells to provide non-volatility. The ferroelectric field-effect transistors providing the state-storage transistors 18, 20 operate using an electric field, not a current as needed by resistive random access memory cells and magnetoresistive random access memory cells. The ferroelectric field-effect transistors providing the state-storage transistors 18, 20 may be exclusively formed using front-end-of-line processes and without the use of back-end-of-line processes. The introduction of the state-storage transistors 18, 20 do not require any modification to the storage unit 12 or the access transistors 34, 36 of the SRAM bit cell. For example, the state-storage transistors 18, 20 of the structure 10 do not require additional transistors to enable the structure with store and restore operations to provide a non-volatile static random access memory cell.

Figure 2:
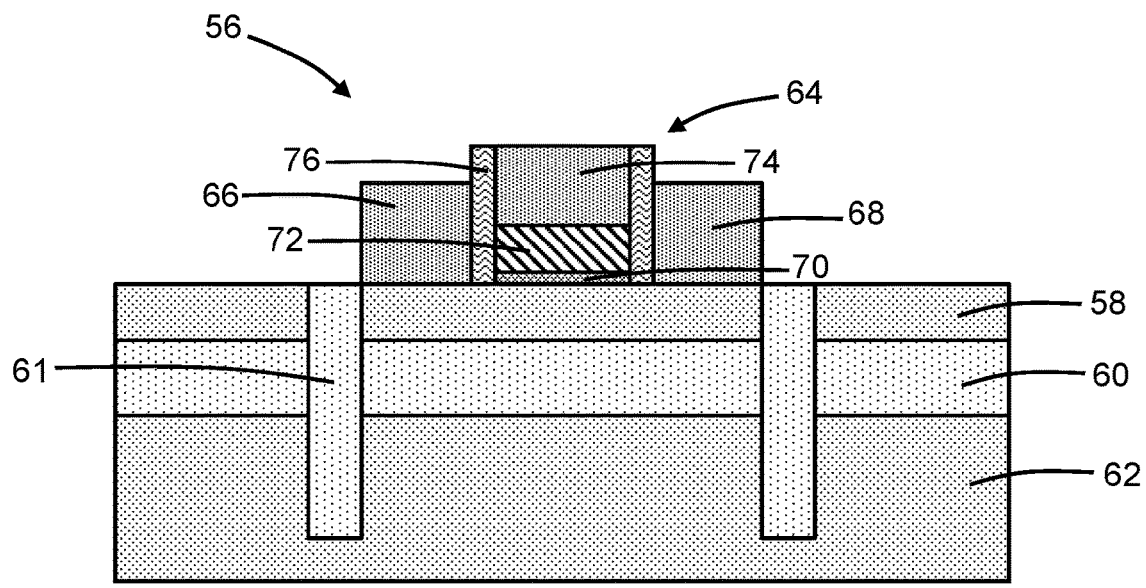
FIG. 2 is a cross-sectional view of a device structure for the ferroelectric field-effect transistors included in the static random access memory bit cell of FIG. 1.

With reference to FIG. 2 and in accordance with embodiments of the invention, a ferroelectric field-effect transistor 56 for deployment in the structure 10 as the state-storage transistors 18, 20 may be formed as a device structure in an active device region of a semiconductor layer 58. The semiconductor layer 58 may be separated from a semiconductor substrate 62 by a dielectric layer 60. The semiconductor layer 58 may be comprised of a semiconductor material, such as single-crystal silicon. The dielectric layer 60 may be comprised of a dielectric material, such as silicon dioxide, that is an electrical insulator. The semiconductor substrate 62 may be comprised of a semiconductor material, such as single-crystal silicon. The semiconductor layer 58, the dielectric layer 60, and the semiconductor substrate 62 may be integrated into a silicon-on-insulator (SOI) substrate.

Shallow trench isolation regions 61 may be formed by patterning shallow trenches in the semiconductor layer 58 that extend to the dielectric layer 60 and optionally into the semiconductor substrate 62, depositing a dielectric material (e.g., silicon dioxide) to fill the shallow trenches, and planarizing and/or recessing the deposited dielectric material. The shallow trench isolation regions 61 surround a portion of the semiconductor layer 58 defining the active device region in which the ferroelectric field-effect transistor 56 is formed.

The ferroelectric field-effect transistor 56 may include a multi-layer gate structure 64 and raised semiconductor layers 66, 68 providing source/drain regions. As used herein, the term "source/drain region" means a doped region of semiconductor material that can function as either a source or a drain of the ferroelectric field-effect transistor 56. The gate structure 64 may provide the gate terminal of the state-storage transistors 18, 20 (FIG. 1), and the raised semiconductor layers 66, 68 may provide the source/drain terminals of the state-storage transistors 18, 20 (FIG. 1).

The gate structure 64 of the ferroelectric field-effect transistor 56 may include an interfacial layer 70 that is arranged on the semiconductor layer 58, a ferroelectric layer 72 that is arranged on the interfacial layer 70, and a gate electrode 74 that is arranged on the ferroelectric layer 72. The interfacial layer 70 is positioned in a vertical direction between the ferroelectric layer 72 and the semiconductor layer 58, and the ferroelectric layer 72 is arranged in a vertical direction between the gate electrode 74 and the interfacial layer 70. The interfacial layer 70 may be comprised of a dielectric material, such as silicon dioxide either grown or deposited, that is an electrical insulator. The ferroelectric layer 72 may be comprised of a ferroelectric material, such as a high-k dielectric material like hafnium oxide or zirconium oxide, that is deposited, for example, by atomic layer deposition. The ferroelectric material of the ferroelectric layer 72, which is an electrical insulator, may have a permittivity that is greater than the permittivity of the dielectric material of the interfacial layer 70. The ferroelectric material constituting the ferroelectric layer 72 may be crystallized by an anneal following deposition. In an embodiment, the ferroelectric layer 72 may include crystalline grains characterized by an orthorhombic phase that exhibits ferroelectricity. The gate electrode 74 may include one or more conductor layers comprised of, for example, doped polysilicon or a metal. The gate structure 64 may be formed by forming a layer stack including thin films of the different materials and patterning the layer stack with photolithography and etching processes.

The ferroelectric material constituting the ferroelectric layer 72 is characterized by a pair of stable remanent polarization states that are persistent and that can be reversibly varied in response to an electric field applied from the gate structure 64. The pair of stable remanent polarization states are appropriate for use in storing and restoring the binary logic state of the storage unit 12 of the structure 10. In particular, the remnant polarization states of the ferroelectric material in the ferroelectric layer 72 determine threshold voltage shifts reflecting the specific binary logic state stored by the ferroelectric field-effect transistor 56. In one remnant polarization state, the net polarization of the ferroelectric material may be oriented parallel to the surface normal. In the other remnant polarization state, the net polarization of the ferroelectric material may be oriented anti-parallel to the surface normal. The ferroelectric field-effect transistor 56 may exhibit different threshold voltages contingent upon whether the ferroelectric material is polarized parallel or antiparallel to the surface normal.

The raised semiconductor layers 66, 68 providing the source/drain regions may be formed on the semiconductor layer 58 adjacent to the opposite sides of the gate structure 64. The raised semiconductor layers 66, 68 may be comprised of a semiconductor material, such as single-crystal silicon. The raised semiconductor layers 66, 68 may be formed by an epitaxial growth process and may be doped during epitaxial growth. In an embodiment, the raised semiconductor layers 66, 68 may be doped (e.g., heavily doped) with a concentration of a dopant, such as an n-type dopant (e.g., phosphorus or arsenic) to provide n-type conductivity. In an alternative embodiment, the raised semiconductor layers 66, 68 may be doped (e.g., heavily doped) with a concentration of a dopant, such as a p-type dopant (e.g., boron) to provide p-type conductivity.

Spacers 76 may be positioned in a lateral direction between the gate structure 64 and the raised semiconductor layers 66, 68. The spacers 76 may be formed by conformally depositing a layer comprised of a dielectric material, such as silicon nitride, and anisotropically etching the deposited layer. The spacers 76 and the gate structure 64 may self-align the formation of the raised semiconductor layers 66, 68.

In an alternative embodiment, the ferroelectric field-effect transistor 56 may be formed using a bulk semiconductor substrate. The gate structure 64 and raised semiconductor layers 66, 68 of the ferroelectric field-effect transistor 56 may be formed on a top surface of the bulk semiconductor substrate. Alternatively, the ferroelectric field-effect transistor 56 may include source/drain regions formed in the bulk semiconductor substrate.

Figure 3:
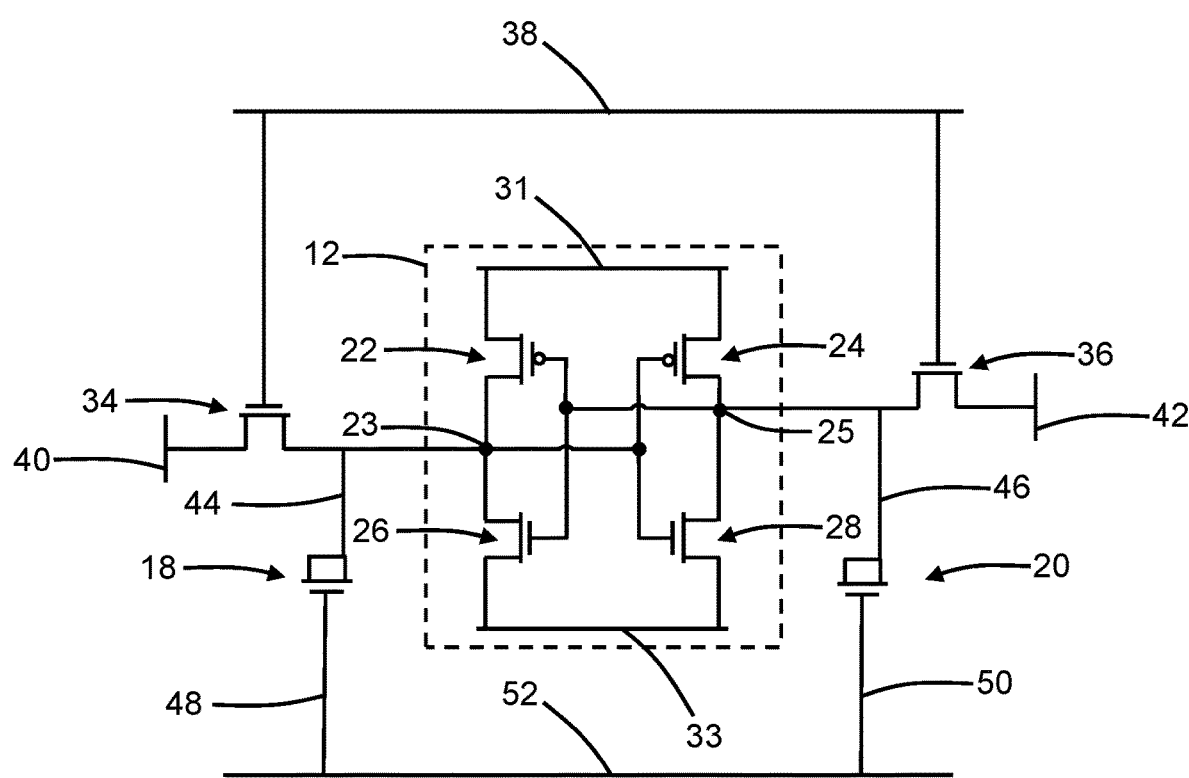
FIG. 3 is a structure including a static random access memory bit cell in accordance with alternative embodiments of the invention.

With reference to FIG. 3 and in accordance with alternative embodiments, a source/drain terminal of the state-storage transistor 18 may be physically and electrically connected by the line 44 to the node 23 of the SRAM bit cell of the structure 10, and a source/drain terminal of the state-storage transistor 20 may be physically and electrically connected by the line 46 to the node 25 of the SRAM bit cell of the structure 10. The gate terminal of the state-storage transistor 18 may be physically and electrically connected by the line 48 to the signal line 52, and the gate terminal of the state-storage transistor 20 may be physically and electrically connected by the line 50 to the signal line 52.

In an embodiment, the lines 44, 46 coupling the source/drain terminals of the state-storage transistors 18, 20 to the nodes 23, 25 may be unswitched. In an embodiment, the lines 44, 46 may directly connect the source/drain terminals of the state-storage transistors 18, 20 to the respective nodes 23, 25. In an embodiment, the lines 48, 50 coupling the gate terminals of the state-storage transistors 18, 20 to the signal line 52 may be unswitched. In an embodiment, the lines 48, 50 may directly connect the gate terminals of the state-storage transistors 18, 20 to the signal line 52.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a static random access memory bit cell including a first node and a second node;
   a first ferroelectric field-effect transistor including a first gate terminal and a first source/drain terminal, the first gate terminal connected to the first node;
   a second ferroelectric field-effect transistor including a second gate terminal and a second source/drain terminal, the second gate terminal connected to the second node; and
   a signal line connected to the first source/drain terminal of the first ferroelectric field-effect transistor by a first unswitched line and to the second source/drain terminal of the second ferroelectric field-effect transistor by a second unswitched line.

2. A structure comprising:
   a static random access memory bit cell including a first node and a second node;
   a first ferroelectric field-effect transistor including a first gate terminal and a first source/drain terminal, the first gate terminal connected to the first node;
   a second ferroelectric field-effect transistor including a second gate terminal and a second source/drain terminal, the second gate terminal connected to the second node; and
   a signal line connected to the first source/drain terminal of the first ferroelectric field-effect transistor and to the second source/drain terminal of the second ferroelectric field-effect transistor,
   wherein the first source/drain terminal of the first ferroelectric field-effect transistor is directly connected to the signal line, and the second source/drain terminal of the second ferroelectric field-effect transistor is directly connected to the signal line.

3. The structure of claim 2 wherein the first gate terminal includes a first ferroelectric layer, and the second gate terminal includes a second ferroelectric layer.

4. The structure of claim 2 wherein the first ferroelectric field-effect transistor and the second ferroelectric field-effect transistor are n-type ferroelectric field-effect transistors.

5. The structure of claim 2 wherein the first ferroelectric field-effect transistor and the second ferroelectric field-effect transistor are p-type ferroelectric field-effect transistors.

6. The structure of claim 1 wherein the static random access memory bit cell includes a first inverter and a second inverter that is cross-connected to the first inverter.

7. The structure of claim 1 wherein the static random access memory bit cell further comprises a first access transistor and a second access transistor, and further comprising:
   a first bit line connected by the first access transistor to the first node; and
   a second bit line connected by the second access transistor to the second node.

8. A method comprising:
   forming a first ferroelectric field-effect transistor including a first gate terminal and a first source/drain terminal, wherein the first gate terminal is connected to a first node of a static random access memory bit cell;
   forming a second ferroelectric field-effect transistor including a second gate terminal and a second source/drain terminal, wherein the second gate terminal is connected to a second node of the static random access memory bit cell; and
   forming a signal line connected to the first source/drain terminal of the first ferroelectric field-effect transistor by a first unswitched line and to the second source/drain terminal of the second ferroelectric field-effect transistor by a second unswitched line.

9. The structure of claim 1 wherein the first gate terminal includes a first ferroelectric layer, and the second gate terminal includes a second ferroelectric layer.

10. The structure of claim 9 wherein the first ferroelectric layer and the second ferroelectric layer comprise a high-k dielectric material.

11. The structure of claim 1 wherein the first ferroelectric field-effect transistor and the second ferroelectric field-effect transistor are n-type ferroelectric field-effect transistors.

12. The structure of claim 1 wherein the first ferroelectric field-effect transistor and the second ferroelectric field-effect transistor are p-type ferroelectric field-effect transistors.

13. The structure of claim 1 wherein the signal line is configured to supply a programming voltage for a store operation to the first ferroelectric field-effect transistor and the second ferroelectric field-effect transistor.

14. The structure of claim 1 wherein the signal line is configured to supply a programming voltage for a restore operation to the first ferroelectric field-effect transistor and the second ferroelectric field-effect transistor.

15. The structure of claim 2 wherein the signal line is configured to supply a programming voltage for a store operation to the first ferroelectric field-effect transistor and the second ferroelectric field-effect transistor.

16. The structure of claim 2 wherein the signal line is configured to supply a programming voltage for a restore operation to the first ferroelectric field-effect transistor and the second ferroelectric field-effect transistor.

17. The structure of claim 2 wherein the static random access memory bit cell includes a first inverter and a second inverter that is cross-connected to the first inverter.

18. The structure of claim 2 wherein the static random access memory bit cell further comprises a first access transistor and a second access transistor, and further comprising:
a first bit line connected by the first access transistor to the first node; and
a second bit line connected by the second access transistor to the second node.

19. The method of claim 8 wherein the signal line is configured to supply a programming voltage for a store operation to the first ferroelectric field-effect transistor and the second ferroelectric field-effect transistor.

20. The method of claim 8 wherein the signal line is configured to supply a programming voltage for a restore operation to the first ferroelectric field-effect transistor and the second ferroelectric field-effect transistor.

* * * * *